United States Patent
Nakaoka

[11] Patent Number: 6,021,077
[45] Date of Patent: *Feb. 1, 2000

[54] SEMICONDUCTOR MEMORY DEVICE CONTROLLED IN SYNCHRONOUS WITH EXTERNAL CLOCK

[75] Inventor: Yuji Nakaoka, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/897,545

[22] Filed: Jul. 21, 1997

[30] Foreign Application Priority Data

Jul. 22, 1996 [JP] Japan .................................. 8-192246

[51] Int. Cl.[7] ...................................................... G11C 7/00
[52] U.S. Cl. .................... 365/221; 365/189.04; 365/219; 365/230.03; 365/230.05; 365/233
[58] Field of Search .................................. 365/221, 219, 365/230.03, 230.05, 45, 189.04

[56] References Cited

U.S. PATENT DOCUMENTS

| | | |
|---|---|---|
| 4,896,294 | 1/1990 | Shimizu et al. ........................ 365/221 |
| 4,945,518 | 7/1990 | Muramatsu et al. .................... 365/221 |
| 5,093,805 | 3/1992 | Singh ..................................... 365/221 |
| 5,398,209 | 3/1995 | Iwakiri et al. ......................... 365/221 |
| 5,524,098 | 6/1996 | Holland et al. ........................ 365/221 |

FOREIGN PATENT DOCUMENTS

| | | |
|---|---|---|
| 0 389 142 | 9/1990 | European Pat. Off. . |
| 572 026 | 12/1993 | European Pat. Off. . |
| 0 591 009 | 4/1994 | European Pat. Off. . |

*Primary Examiner*—Son T. Dinh
*Attorney, Agent, or Firm*—Sughrue, Mion, Zinn, MacPeak & Seas, PLLC

[57] ABSTRACT

A semiconductor memory device of the present invention comprises, a first memory cell 110, a first data line DLN connected to the first memory cell, a second data line IOT, a first select signal CSL(E) controlling connection/disconnection between the first data line and the second data line, a second memory cell 112, a third data line DTN connected to the second memory cell, a fourth data line IOT, a second select signal CSL (O) controlling connection/disconnection between the third data line and the fourth data line, wherein a timing selecting the first and second memory cells at the writing operation is the same of a timing selecting the first and second memory cells at the reading operation.

21 Claims, 15 Drawing Sheets

SEMICONDUCTOR MEMORY DEVICE CONTROLLED IN SYNCHRONOUS WITH EXTERNAL CLOCK

BACKGROUND OF THE INVENTION

This invention relates to a semiconductor memory device, and more particularly a semiconductor memory device controlled in synchronism with an external clock. There has appeared a dynamic random access memory (DRAM) which is synchronous with an external system clock. i.e. a synchronous DRAM (SDRAM) in order to achieve demand of a high-speed random access.

This SDRAM latches either an address or a command applied to each of the pins at a rising edge of an external clock (CLK) and operates internally synchronized to the external clock. An active command is given to the SDRAM synchronized with a clock edge of the external clock CLK. This corresponds to an operation in which /RAS (Row Address Strobe) is changed from high level to low level at DRAM. That is, a word line corresponding to the row address applied to an address pin is selected by an active command to the SDRAM. When a precharging command is given to a SDRAM in synch with a clock edge of the external clock CLK, this corresponds to an operation in which /RAS is changed from a low level to a high level at the general DRAM. That is, Data is restored in the selected memory cell, the selected word line becomes a non-selected one and a node connected between the selected memory cell and the associated bit lines is precharged.

As one of the operation modes of the SDRAM, there is provided a Column Address Strobe (CAS) latency. This is defined by the number of clocks needed or consuming from input of read command to output of the respective read data. Outputing or inputing consecutive addresses during a read cycle or a write cycle is called a burst and a circuit for generating the consecutive addresses is called a burst counter.

In the case of the SDRAM, it is important for increasing a performance how fast consecutive addresses can be read out or written in synch with the external clock CLK, i.e. to what degree a frequency of the external clock CLK can be increased. As a method for increasing an operation frequency, there is provided a 2-bit pre-fetch system. Such a system has a memory cell array (EVEN) of even numbered address and a memory cell arrays (ODD) of odd number addresses, an access for the cell is carried out concurrently for two bits at consecutive addresses and an access of the external input output pins is carried out in a serial manner, thereby increasing the operating frequency.

However, control of reading or writing of such a system is difficult. That is, in a write cycle, after a write command is carried out, two data are latched after being inputed in a serial manner and the latched two data are stored in respective memory cells in parallel at a same time. Such a system needs the time period for latching the two data after the write command is carried out. On the other hand, in read cycle, after the read command is carried out, the consecutive two data are immediately read out. Accordingly, the circuit producing these timings is complex since the timing of writing is different with that of reading. Additional, the writing period is longer than the reading period.

SUMMARY OF THE INVENTION

It is an object of the present invention to provide an improved semiconductor memory device such that writing operation in a pre-fetch system can be completed faster.

It is an other object of the present invention to provide a semiconductor memory device such that circuits used for reading and writing are more simple.

A semiconductor memory device of the present invention receives a plurality of first data from an input terminal in serial and transfers said first data into an associated memory cell at the same time at writing operation, reads second data stored in a plurality of memory cells at the same time and outputs the second data to an output terminal in serial at reading operation, wherein a timing selecting a memory cell at the writing operation and at the reading operation are the same each other.

Another semiconductor memory device of the present invention comprises, a first memory cell, a first data line connected to the first memory cell, a second data line, a first select signal controlling connection/disconnection between the first data line and the second data line, a second memory cell, a third data line connected to the second memory cell, a fourth data line, a second select signal controlling connection/disconnection between the third data line and the fourth data line, wherein a timing selecting at least one of the first and second memory cells at the writing operation is the same of a timing selecting at least one of the first and second memory cells at the reading operation.

BRIEF DESCRIPTION OF THE DRAWINGS

The above and other objects, advantages and features of the present invention will be more apparent from the following description taken in conjunction with the accompanying drawing, in which.

DESCRIPTION OF THE PREFERRED EMBODIMENTS

Figure 1:
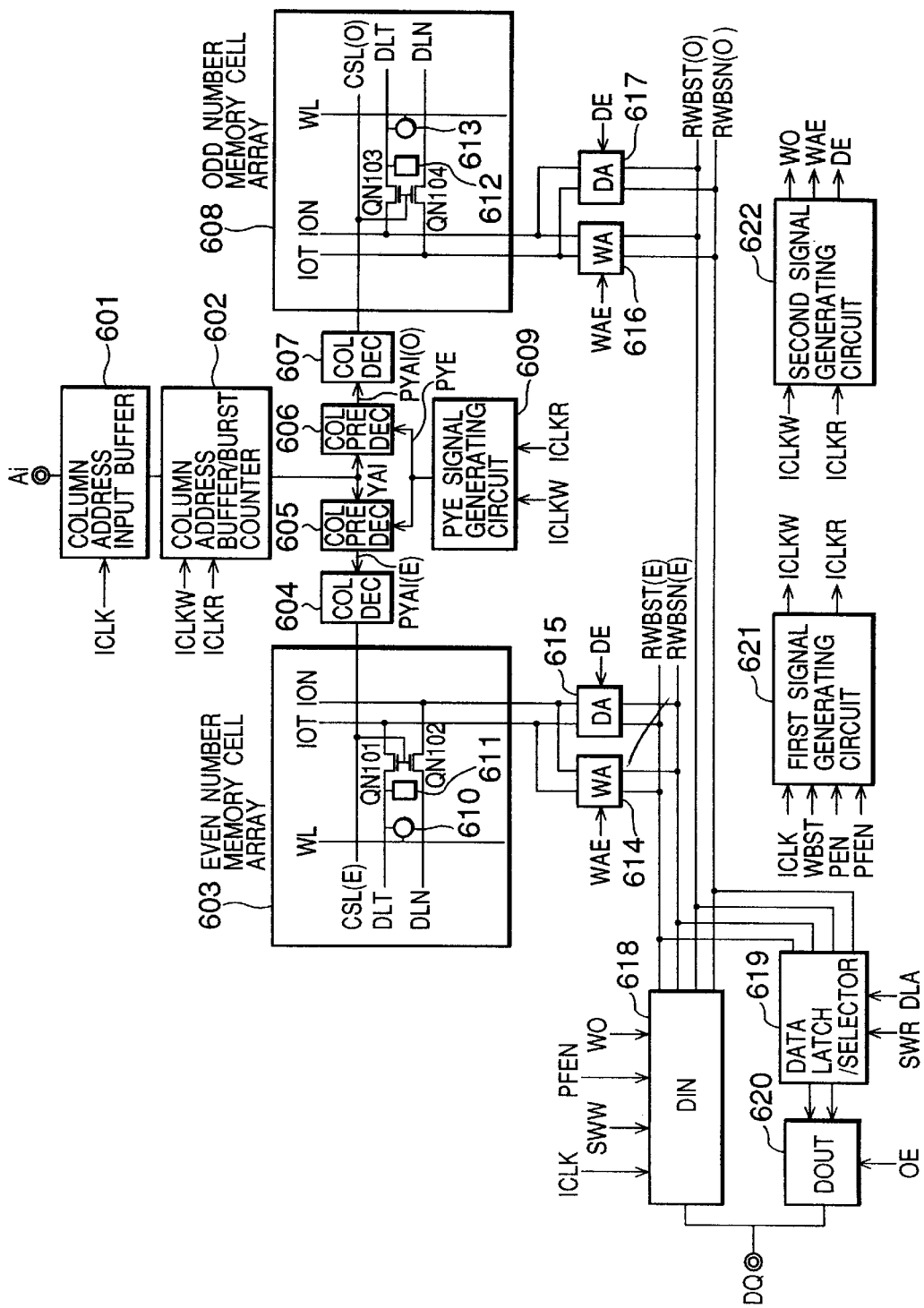
FIG. 1 is a circuit configuration view for showing one example of the related art.

Before embodiments of the present invention are described, the related arts will be proposed or described in detail referring to the drawing, by the inventor.

Referring to FIG. 1, a circuit configuration diagram for illustrating a 2-bit pre-fetch type semiconductor memory device of the related art is shown. This semiconductor memory device is comprised of a column address input buffer 601; a column address buffer and burst counter 602; an even number address memory cell array 603; an odd number address memory cell array 608; column decoders (CDEC) 604 and 607; column pre-decoders (CPDEC) 605 and 606; a PYE signal generating circuit 609; memory cells 610 and 613; sensing amplifiers (SA) 611 and 612; write amplifiers (WA) 614 and 616; data amplifiers (DA) 615 and 617; a data-in-buffer (DIN) 618; a data latch/selector 619; a data-out buffer (DOUT) 620; a first signal generating circuit 621; and a second signal generating circuit 622 or the like. QN101 to QN104 in the memory cell arrays 603 and 608 are N channel transistors. The memory cell array 603 comprises a memory cell 610, word line connected to the memory cell 610, a data line DLT connected to the memory cell 610, a sense amplifier 611 connected to the data line DLT and to a data line DLN, input/output data lines IOT/ION, the transistor QN101 coupled between the data lines DLT and IOT, the transistor QN102 coupled between the data lines DLN and ION, a column select line coupled to gates of the transistors QN101/QN102. The memory cell array 608 is the same structure of the memory cell array 603.

Figure 2:
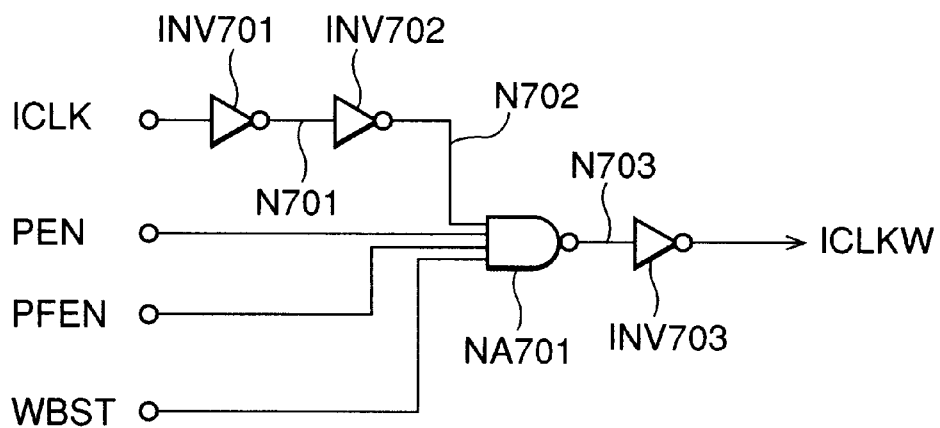
FIG. 2 is a detailed circuit diagram for showing one example of a first signal generating circuit 621 in FIG. 1.
Figure 2:
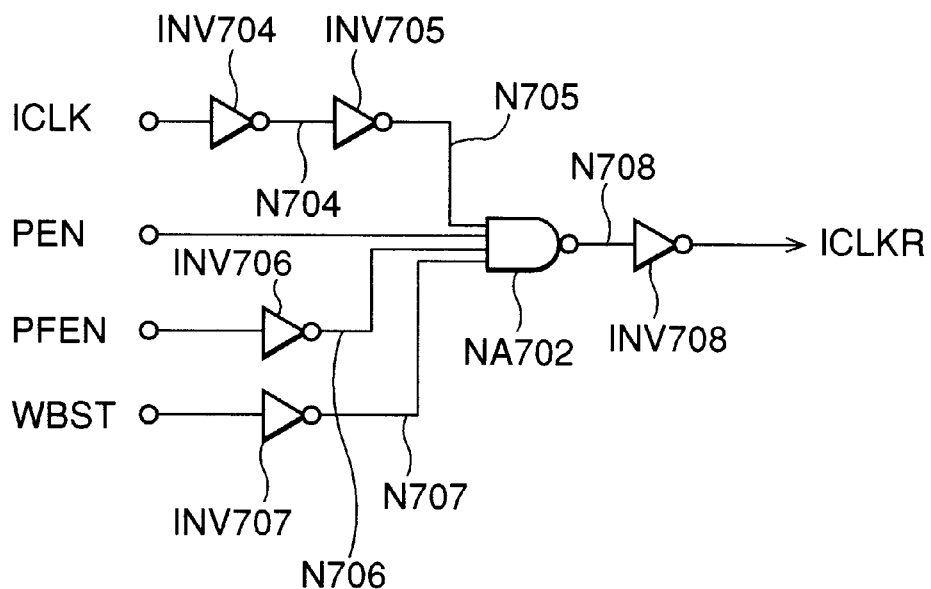

Referring to FIG. 2, the first signal generating circuit 621 is comprised of series-connected inverting circuits or inverters INV701 and INV702 to which the internal clock signal ICLK is inputted and from which the signal N702 is outputted; a 4-input NAND circuit NA701 receiving a ICLK, a pipeline enable (PEN) signal, pipeline prefetch enable (PFEN) signal and write burst (WBST) signal; an inverting circuit INV703 for inverting a polarity of an output signal N703 of NANS circuit NA701 and outputting the signal internal write CLK (ICLKW); series-connected inverting circuits INV704 and 705 to which the internal clock signal is inputted and from which a signal N705 is outputted; inverting circuits INV706 and INV707; 4-input NAND circuit NA702; and an inverting circuit INV708 for inverting polarity of the output signal N708 of NA702 and outputting the signal internal read CLK (ICLKR).

Figure 3:
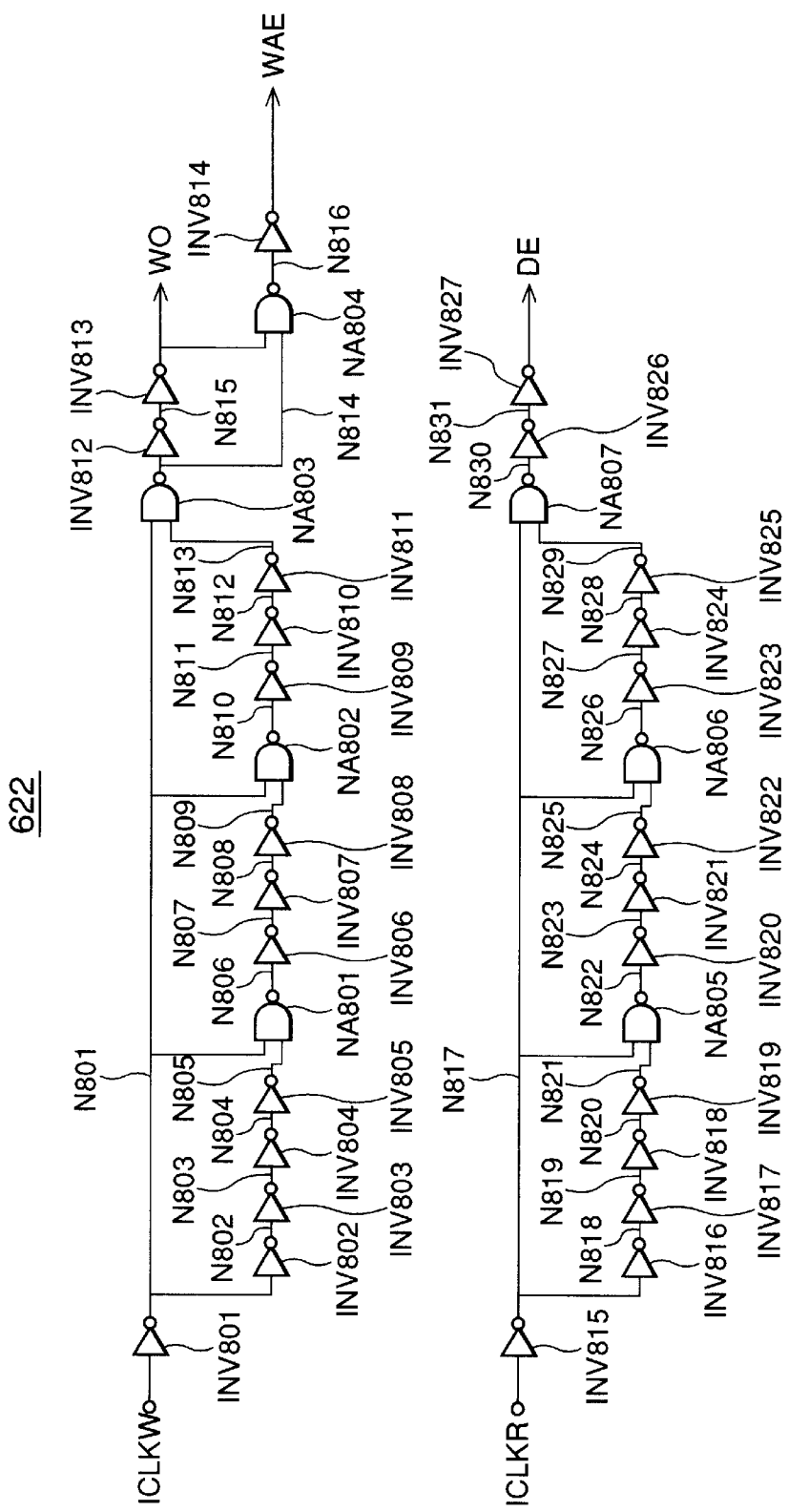
FIG. 3 is a detailed circuit diagram for showing one example of a second signal generating circuit 622 in FIG. 1.

Referring to FIG. 3, the second signal generating circuit 622 is comprised of inverting circuits INV801 to 813 to which the clock signal ICLKW is inputted and from which a write signal W0 is outputted; a circuit segment comprised of NAND circuits NA801 to NA803; NAND circuit NA804 to which an output signal N814 of NAND circuit NA803 and the signal W0 of the inverting circuit INV813 are inputted; an inverting circuit INV814 for inverting a polarity of the output signal N816 of this NAND circuit NA804 and outputting a write amplification activating signal WAE; inverting circuits INV815 to 827 to which the clock signal ICLKR is inputted and from which a data amplifier enable signal DE is outputted; and a circuit segment comprised of NAND circuits NA805 to NA807.

Figure 4:
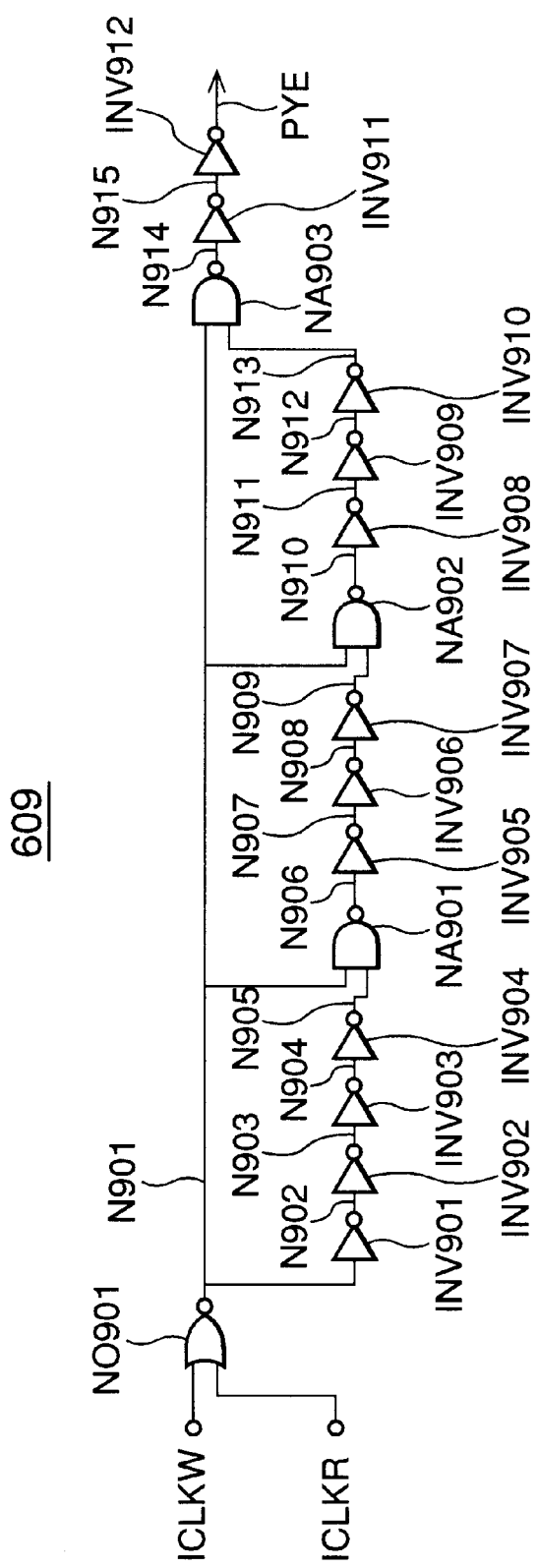
FIG. 4 is a detailed illustrative view for showing one example of a PYE signal generating circuit.

Referring to FIG. 4, the pre-decoder enable (PYE) signal generating circuit 609 is comprised of a NOR circuit or gate NOR901 for receiving each of the clock signals ICLKW and ICLKR as input signals and outputting a signal N901; inverting circuits INV901 to 910 and NAND circuits NA901 to NA903 for receiving the signal N901 as an input signal and outputting a signal N914; and series-connected inverting circuits INV911 and 912 for outputting a signal PYE from the signal N914.

Figure 5:
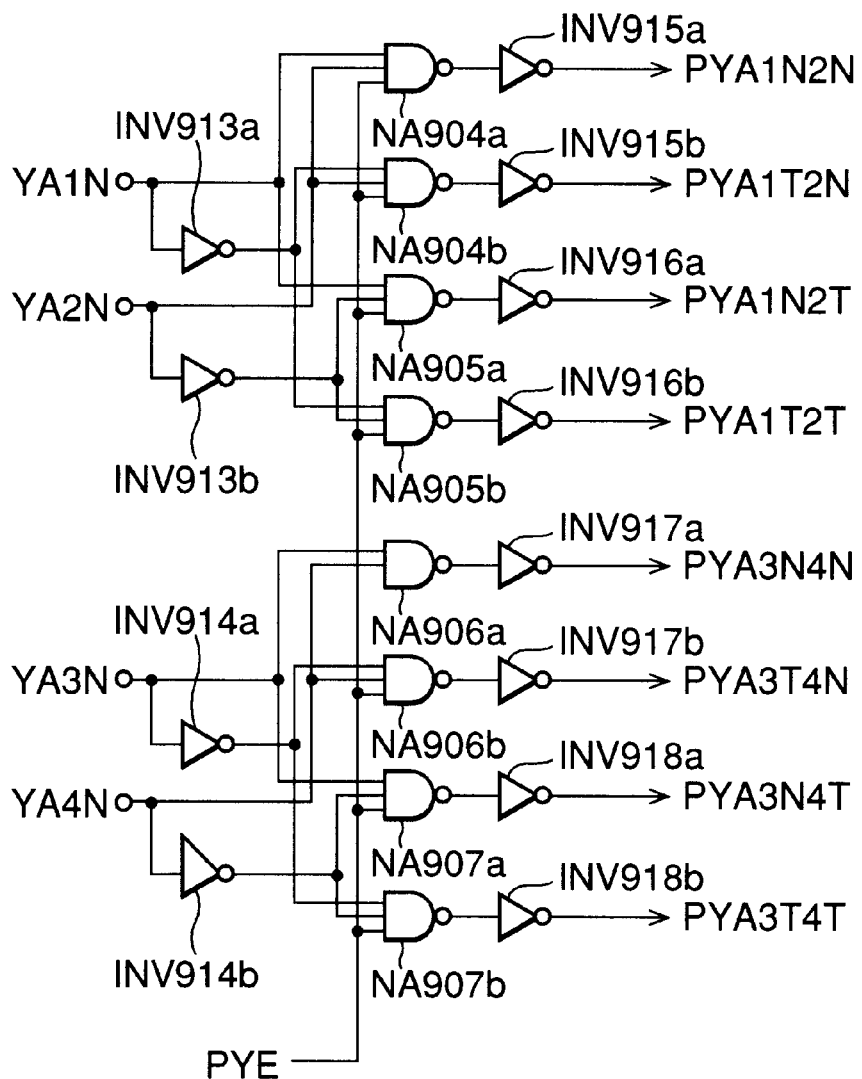
FIG. 5 is a detailed illustrative view for showing one example of a column pre-decode circuit.
Figure 6:
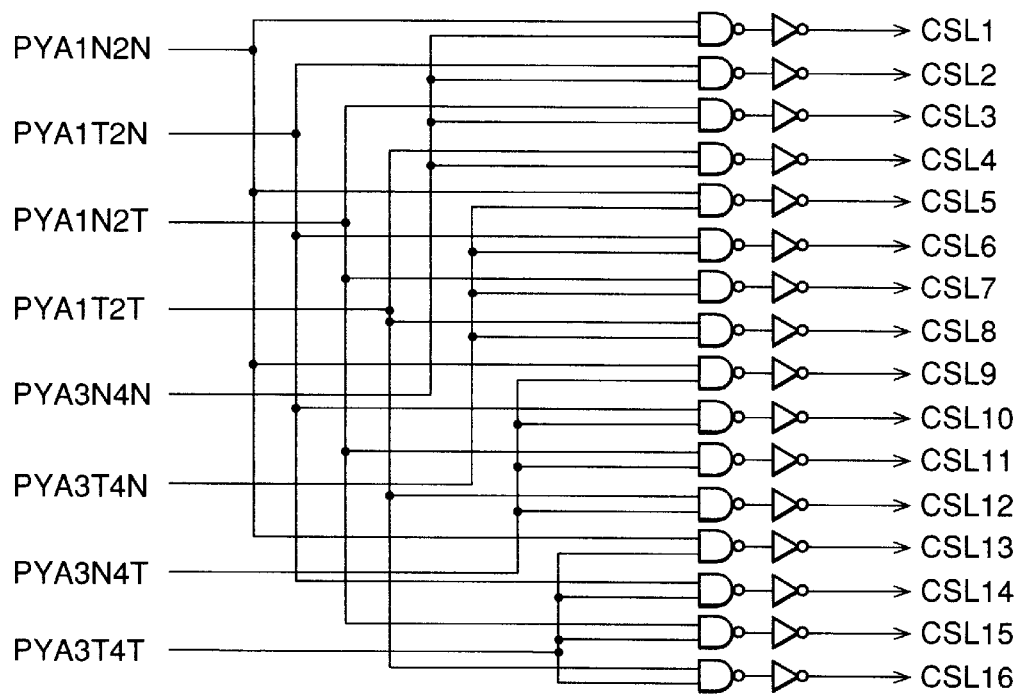
FIG. 6 is a detailed illustration of one example of a column decode circuit.

Referring to FIG. 5, the column pre-decoder 605 (606) is comprised of inverting circuits INV915 to INV918 for outputting each of decoded column addresses PYA1N2N, PYA1T2N, PYA1N2T, PYA1T2T, PYA3N4N, PYA3T4N, PYA3N4T and PYA3T4T, NAND circuits NA904 to NA907 receiving address signals YA1N, YA2N, YA3N and YA4N and outputting decoded signals to the associative inverting circuit in response to the signal PYE; and 4-inverting circuits INV913 to INV914 referring to FIG. 6, the column decoder 604 (607) receiving the decoded column addresses PYA1N2N, PYA1T2N, PYA1N2T, PYA1T2T, PYA3N4N, PYA3T4N, PYA3N4T and PYA3T4T to produce CSL signals CLS1 to CLS16.

Figure 7:
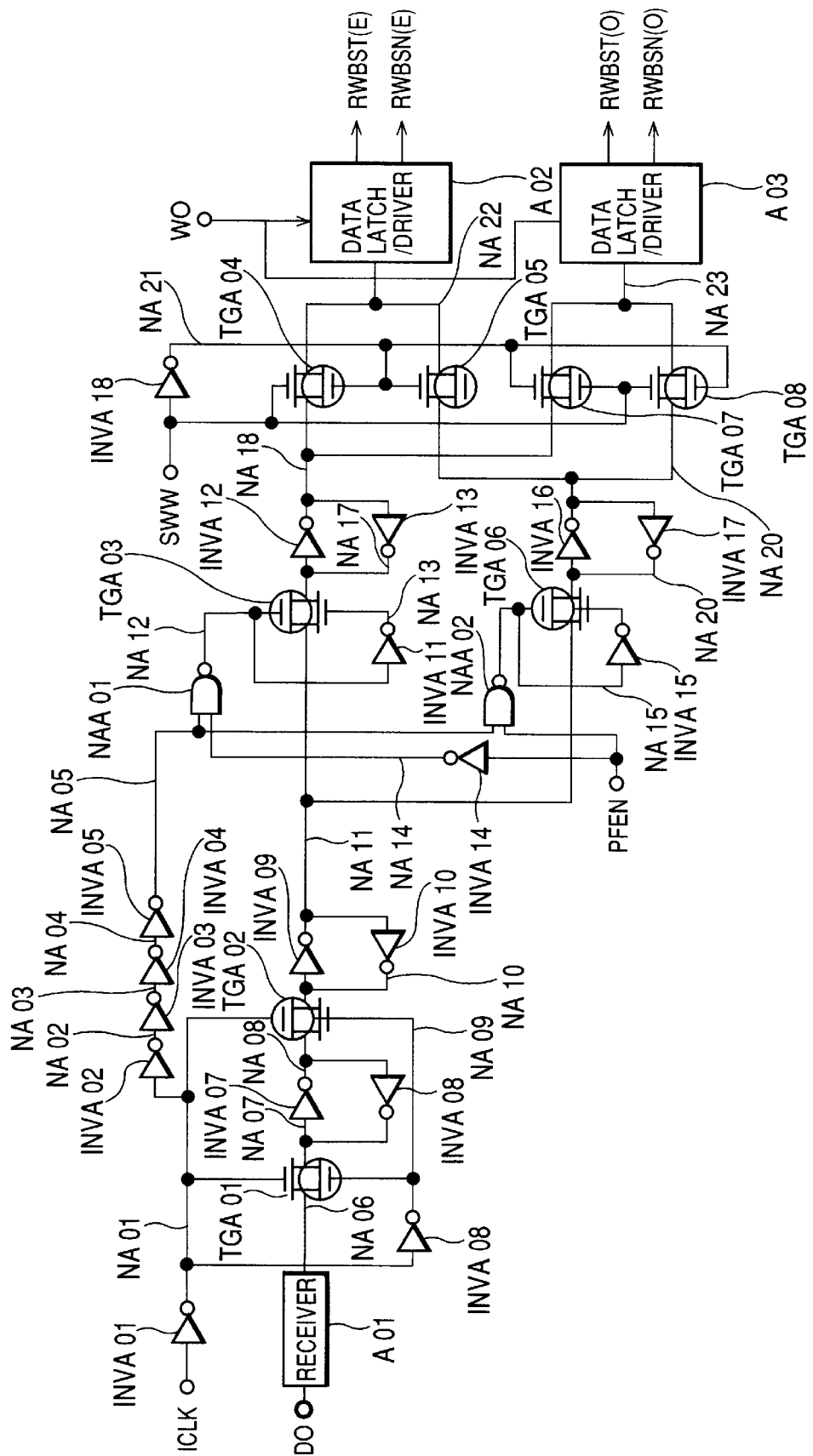
FIG. 7 is a detailed illustration of one example of a data-in-buffer.

Referring to FIG. 7, the data-in-buffer 618 receives the internal clock signal ICLK, an external data signal DQ and a write data switching signal SWW and the signal PFEN as input signals, and is comprised of a receiver A01; inverting circuits INVA01 to INVA18; transfer gates TGA01 to TGA08; NAND circuits NAA01 to NAA02; and data latch and drivers A02 and A03. This data-in-buffer outputs a signal RWBST(E), a signal RWBSN(E), a signal RWBST (O) and a signal RWBSN(O).

The writing and the reading-out operations are carried out concurrently for a certain initial address and consecutive address, that is, consecutive two addresses. This method is called a pre-fetch method. Accordingly, an actual writing operation is started after the two writing data corresponding to the consecutive two addresses are inputted. Writing data at address Aa0 and its subsequent address Aa1 are inputed the terminal DQ in serial order. A state of SWW signal is determined in response to whether the address is an even (EVEN) number address or an odd (ODD) number address. That is, it is determined to what address is applied the first-inputted-data. In this case, the address is an even number address, so that the SWW signal becomes a high level. In addition, an inputting of the data signal DQ for every time with the external clock signal CLK is carried out in synch with the internal clock signal ICLK, an inputting of the initial data signal DQ is latched by a flip-flop made by INVA12 and INVA13, subsequently the signal is latched by flip-flop made by INVA16 and INVA17. This latching operation is carried out by changing the PFEN signal to a low level when a burst starting is performed. The PFEN signal is acted in such a manner that its state is changed with the internal clock signal ICLK every time the external clock signal CLK is changed from its low level to its high level during burst operation. Accordingly, the writing operation is started from a next clock cycle (C2 cycle) in which the burst operation is started and then a writing operation is performed concurrently in respect to the consecutive two addresses for every two clocks. Accordingly, after two write data are latched, in synch to signal W0, the two write data are outputed to the RWBST/N(E) and RWBST/N(O) respectively at the same time.

Figure 8:
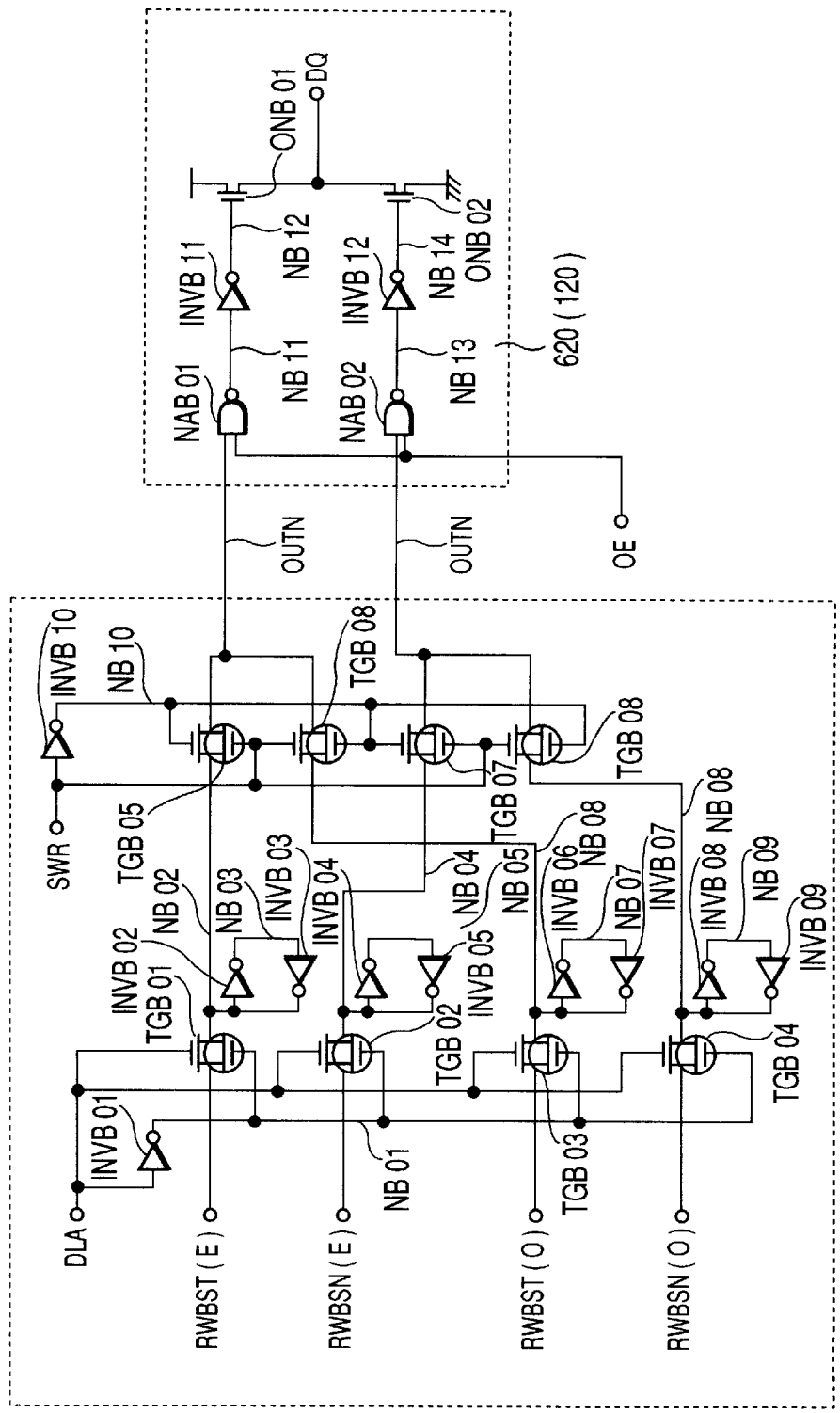
FIG. 8 is a detailed illustration of one example of a data-out-buffer and a data latch/selector.

Referring to FIG. 8, the data latch/selector 619(119) receives a data latch (DLA) signal, a read data switching (SWR) signal, a signal RWBST(E), a signal RWBSN(E), a signal RWBST(O) and a signal RWBSN(O) as input signals and outputs output signals OUTT and OUTN under arrangement comprised of inverting circuits INVB01 to INVB10 and transfer gates TGB01 to TGB08. Further, the data-out-buffer 620(120) receives the aforesaid signals OUTT, OUTN and a output enable (OE) signal as input signals, is comprised of NAND circuits NAB01, NAB02, inverting circuits INVB11, INVB12, and N-channel transistors ONB01 and ONB02 and outputs a data signal DQ.

Referring to a timing chart of FIG. 9, its operation will be described as follows. For a sake of convenience in simple description, a state in which a CAS latency (CLT)=3 and a burst length (BL)=4 are set will be described.

At first, a write cycle will be described. A write command is inputted in synchronous with the external clock CLK at C1 cycle. Then, writing operation is started. At that time, the external address (in this case, an even number address of Aa0) is inputted from external address input terminals (not shown), an initial address of burst is determined and a writing data correspondingly to the initial writing address Aa0 is also inputted through a DQ pin. During writing operation, the WBST signal is a high level and a PEN signal is also a high level.

The PFEN signal is changed from low level to high level in response to the second external clock signal CLK at C2 cycle so that the clock signal ICLKW becomes a one-shot signal of high level. With such an arrangement as above, the internal burst start address is generated, PYE signal becomes a signal having a long one-shot width of high level from low level in reference to the circuit diagram of FIG. 4, pre-decode signals corresponding to the consecutive two addresses (EVEN/ODD) are generated, thereby the CSL signals of odd number and even number also become one-shot pulse of high level from low level. Concurrent with this operation, a W0 signal and a write amplification activating signal WAE also become one-shot pulses of high level from low level. The data-in-buffer 618 drives both even number/odd number RWBST/N based on the latched data (Aa0)(Aa1) in response to W0 signal, the write amplifiers 614, 616 are activated in response to the write amplification activating signal WAE, thereby the Data (Aa0)(Aa1) is transferred into two sensing amplifiers 611 and 612 through IOT/N. Thus, the data (Aa0)(Aa1) are written into two memory cells through DLT/N. The writing operation is carried out while CSL signals are activated between cycles C2 and C3 in response to the selected address. That is, the writing operation is being carried out during two CLK cycles.

At cycle C4, the PFEN signal also changes from a low level to high level, thereby the clock ICLKW becomes high level. The CSL lines is activated in response to the subsequent two continuous addresses Aa2 and Aa3 respectively. On the other hand, the signals W0 and WAE are activated in response to the clock ICLKW producing at cycle C4 and the data (Aa2) (Aa3) latched in DIN 618 are written into the associated two memory cells through DLT/N during cycle C4 and C5.

Then, a subsequent reading-out operation will be described. Upon inputting of the read command at cycle C6, the WBST signal is changed to a low level and PEN signal is changed to a high level. Accordingly, the internal clock signal ICLKR outputted by the first signal generating circuit 621 becomes one-shot pulse of high level from a low level, and PYE signal becomes a relative long one-shot pulse in the same manner as that of the writing operation.

With such an arrangement as above, the internal pre-decode address is generated and CSL(E) and CSL(O) corresponding to the consecutive two addresses (Ab0 and Ab1 in this case) are changed from a low level to a high level during cycle C6. Accordingly, data in the memory cells of the even number address Ab0 and the odd number address Ab1 are sent the data amplifiers (DA) 615, 617 through and DLT/N and IOT/N.

In turn, a data amplification enable (DE) signal generated by the second signal generating circuit 622 is also changed from a low level to a high level by one-shot of the internal clock signal ICLKR to cause DA615 and 617 to become an operated state, the DA 615 and 617 amplifies the data (Ab0)(Ab1) to drive RWBST/N(E) and RWBST/N(O).

Accordingly, the data are transmitted concurrently to RWBST/N(E) and RWBST/N(O), thereby the data are supplied to a data latch/selector 619, and then a signal DLA becomes one-shot pulse and the data latched by each of the flip-flops composed of inverting circuits INVB02, INVB03, inverting circuits INVB04, INVB05, inverting circuits INVB06, INVB07 and inverting circuits INVB08, INVB09.

In this case, CAS CLT=3, when the external clock signal CLK which is the third order from the external clock signal CLK having the read command is changed from a low level to a high level (C8 cycle in FIG. 9), SWR signal becomes a low level, data correspondingly to the initial address Ab0 (even number) being latched by the inverting circuits INVB02, INVB03 and inverting circuits INVB04, INVB05 are outputted to OUTT/N and further an output enable (OE) signal is changed from a low level to a high level, thereby it is outputted from the DQ pin to an external side through the data-out-buffer 620.

The SWR signal becomes a high level at a next clock CLK (a C9 cycle shown in FIG. 9), data correspondingly to next address Ab1 (odd number) being latched by the inverting circuits INVB06, INVB07 and the inverting circuits INVB08, INVB09 are outputted to OUTT/N and further they are outputted to an external side from DQ pin through the data-out-buffer 620. Subsequently, the data correspondingly to the addresses Ab2 and Ab3 are outputted in sequence to the external side in the same manner as that described above and a reading-out operation with the burst length 4 is completed.

As described above, since the writing operation with 2-bit pre-fetch system generates the internal address after inputting two writing data (cycles C1 and C2), the CSL signal rises at cycle C3. On the other hand, after the read command is inputed at cycle C6, the CSL signal rises at cycle C7. a rising of the CSL signal of the write operation is delayed by 1 CLK cycle in respect to the reading-out operation and also an actual writing operation is delayed by an amount corresponding to 1 CLK cycle in respect to the reading-out operation. Accordingly, in the case that the burst length is "4", after the burst writing operation is carried out continuously during four CLK cycles, it is possible to enter a write command for a next group of addresses at 5 cycle, although it is not possible to enter a read command immediately at 5 cycle. That is, a reading-out operation command must be inputted after elapsing of 1 CLK cycle (6 cycle). This is due to a presence of possibility that if the read command is inputted at cycle C5, an address corresponding to the reading-out operation is concurrently inputted, the respective even number/odd number addresses are generated and two CSL signals are raised, so that it may be overlapped with the CSL having a delayed raising during writing operation.

Figure 9:
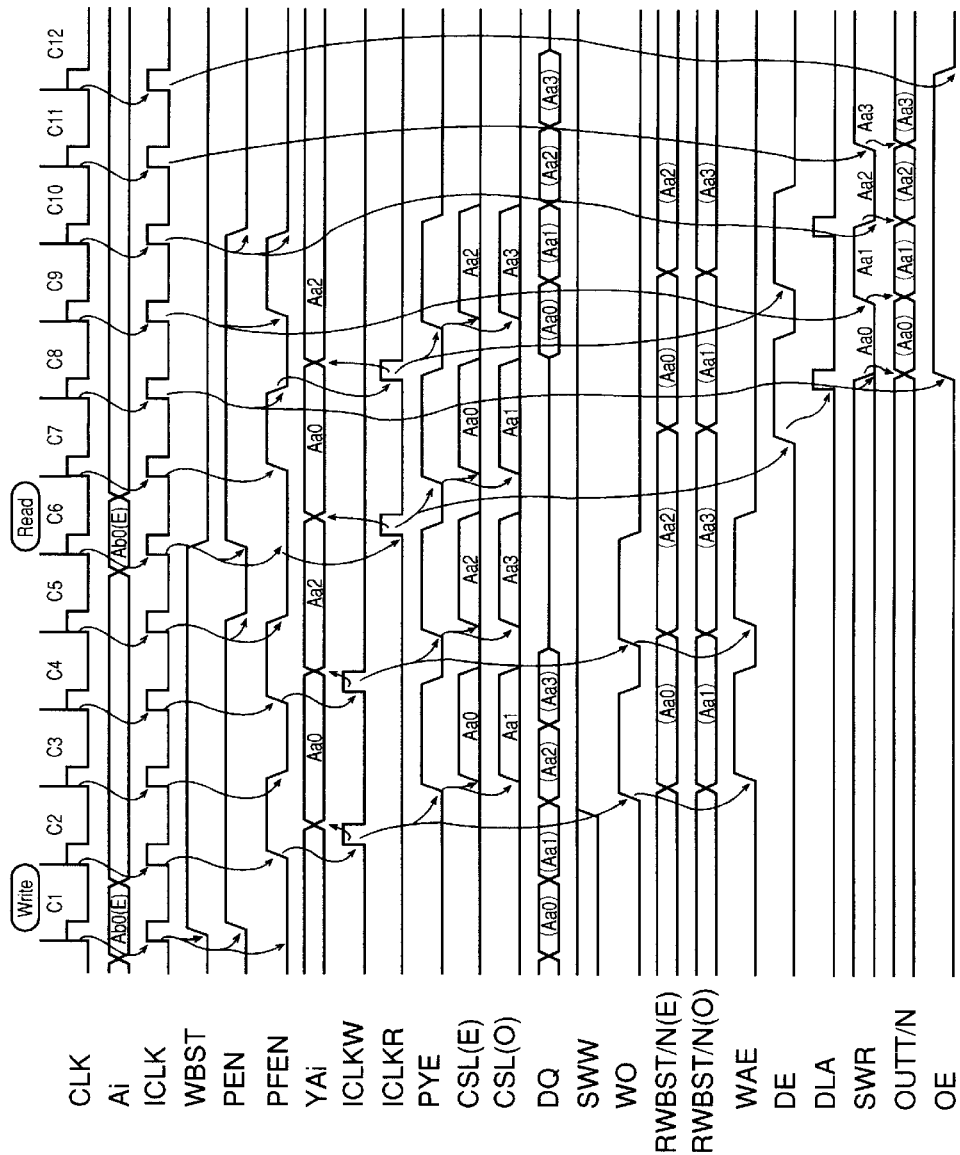
FIG. 9 is a timing chart for illustration of operation in FIG. 1.

As mentioned, in the related art semiconductor memory device, the internal address is generated after the writing data of 2 bits is confirmed upon inputting of a write command during writing operation as indicated in the timing chart shown in FIG. 9, i.e. from the 2 clocks and after a CSL for the two addresses is selected, the writing operation is carried out, so that a timing to raise the CSL signal is delayed by an amount corresponding to 1 clock counted from the read/write command as compared with that of the reading-out operation. Accordingly, in the related art semiconductor memory device, it was necessary to put the read command after writing operation in a time space of 1 clock upon completion of the burst operation.

Referring now to FIGS. 10–15, the present invention will be described.

Figure 10:
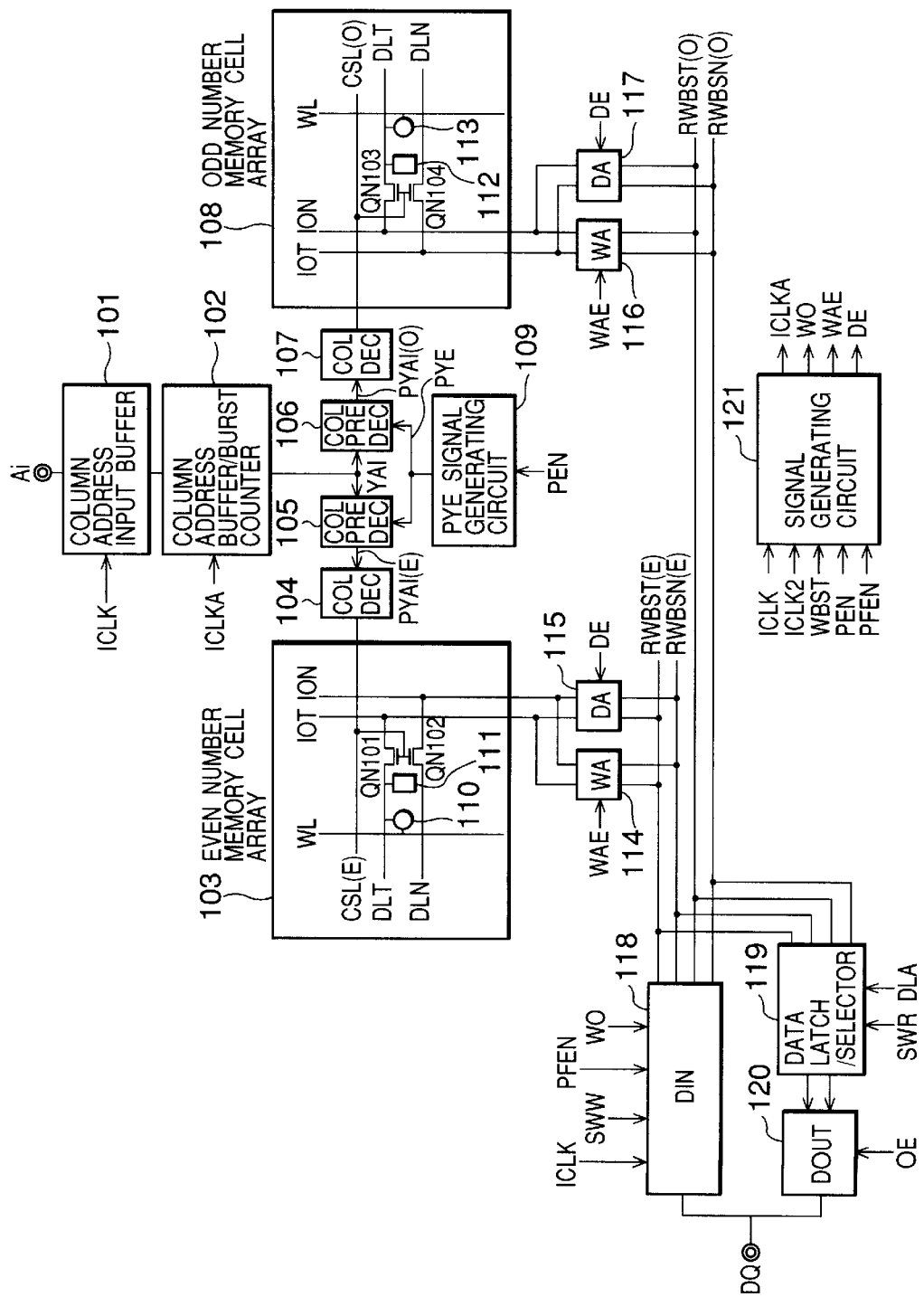
FIG. 10 is a circuit configuration of first embodiment of the present invention.

FIG. 10 is a circuit configuration for showing first embodiment of the semiconductor memory device of the present invention. This semiconductor memory device has features in the configuration of signal generating circuit 121 and the configurations of the column pre-decoder 105 (106) and the PYE signal generating circuit 109. The circuit configurations except the circuit 109, 105 (106), 121 and 102 are similar to those of the semiconductor device according to the related art.

Figure 11:
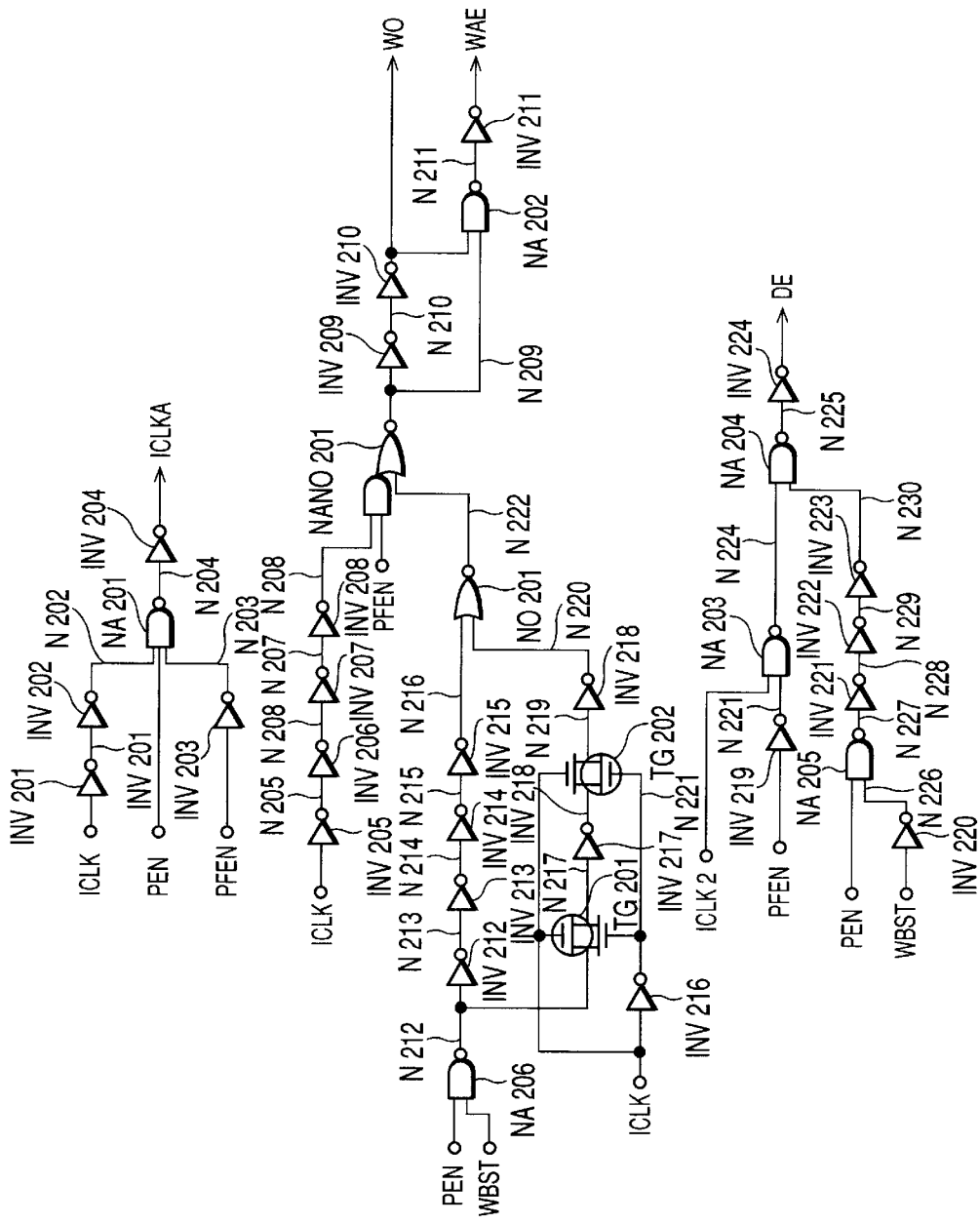
FIG. 11 is a detailed circuit diagram for showing a first embodiment of a signal generating circuit 121 of the present invention.

Referring to FIG. 11, the signal generating circuit 121 is comprised of series-connected inverting circuits INV201 and 202 to which the internal clock signal ICLK is inputted and from which the signal N202 is outputted; an inverting circuit INV203 for inverting a polarity of the signal PFEN; 3-input NAND circuit NA201 to which signals PEN and N202 and an output signal N203 of the inverting circuit INV203 are inputted; and an inverting circuit INV204 for inverting a polarity of the output signal N204 of the NAND circuit NA201 and outputting a clock signal ICLKA.

In addition, the signal generating circuit 121 is comprised of four-stage series connected inverting circuits INV205 to INV208 to which the internal clock signal ICLK is inputted and from which the signal N208 is outputted; an AND circuit to which the signal N208 and the signal PFEN are inputted; NOR circuit NAN0201; NAND circuit NA206 to which the signal PEN and the signal WBST are inputted and from which a signal N212 is outputted; 4-stage series connected inverting circuits INV212 to INV215 to which the signal N212 is inputted and from which a signal N216 is outputted; inverting circuits INV216 to INV218 for outputting the signal N220 in response to the internal clock signal ICLK; transfer gates TG201 to TG202; a NOR circuit NO201 for outputting a signal N222 in response to the signals N216 and N220; and inverting circuits INV209 to 211 and a NAND circuit NA202 for outputting the signals W0 and WAE in response to the output signal of NANO201.

That is, rising of the signals W0 and WAE is delayed by an amount corresponding to 1 clock period by the circuit segment comprised of transfer gates TG201, TG202 and the inverting circuit INV217 controlled by the internal clock signal ICLK.

Further, the signal generating circuit 121 has a circuit segment which is comprised of inverting circuits INV219 to INV224 for receiving the clock signal ICLK2, signal PFEN, signal PEN and signal WBST as its input signals and outputting a data enable signal DE; and NAND circuits NA203 to NA205. The signal ICLK2 is generated by delaying the signal ICLK.

Figure 12:
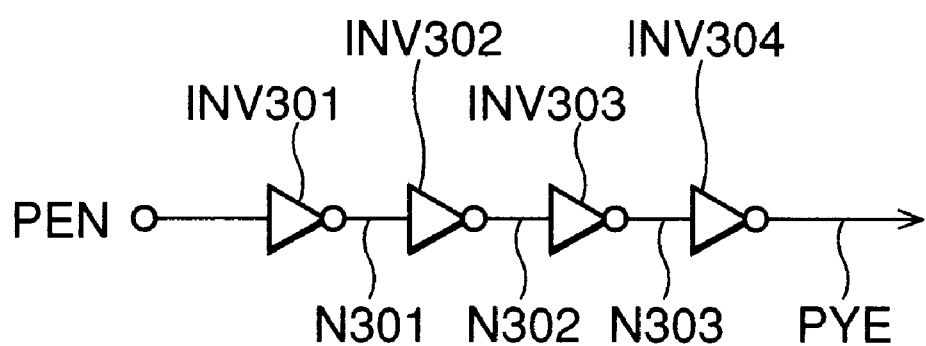
FIG. 12 is a detailed circuit diagram for showing one preferred embodiment of a PYE signal generating circuit in FIG. 8.

In turn, as shown in FIG. 12, the PYE signal generating circuit 109 is comprised of 4-stage series connected inverting circuits INV301 to INV304 for receiving a PEN signal of the burst period high level as an input signal and outputting the PYE signal. The PYE signal of the present invention responds to and is produced by delaying the PEN signal. The PYE signal is high level during burst operation since the PEN signal indicates a burst operating state. Therefore, the CLS signals respond to the address signal YAi as shown in FIGS. 5 and 6.

Then, referring to the timing chart shown in FIG. 13, an operation of first embodiment will be described. In this case, for a sake of convenience in description, the case in which the CAS CLT is "3" and the burst length (BL) is "4" will be described.

At cycle C1, as the write command is in synch with the external clock signal CLK, the writing operation is started. At that time, the external address (Aa0 (even number address) is assumed to be set in this case) is taken from the external address terminal (not shown) and an initial address of the burst is determined. Additional, then the writing data corresponding to the initial writing address Aa0 is inputted from DQ pin.

That is, when a write command input is synchronized with the external clock signal CLK at a cycle C1, WBST signal is changed from low level to high level and PEN signal is also changed from low level to high level. At this time, PFEN signal is kept at low level. As the PEN signal changes to a high level and the PFEN signal is at a low level, the internal clock signal ICLKA of one-shot pulse of high level in synch with the external clock signal ICLK is generated from the inverting circuit INV204 in the signal generating circuit 121 shown in FIG. 11.

Figure 13:
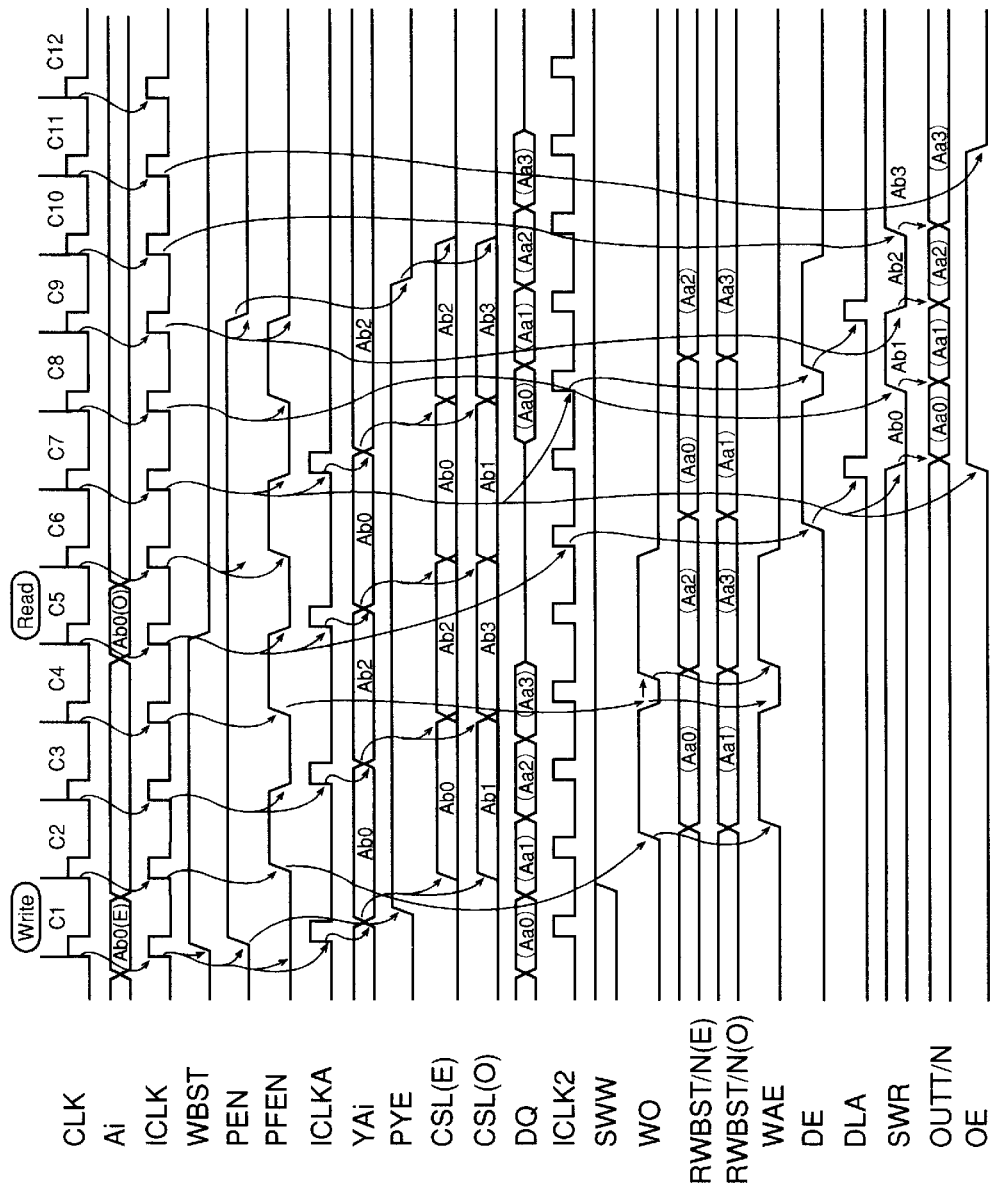
FIG. 13 is a timing chart for illustrating an operation of a first embodiment of the present invention.

The external address Aa0 already is inputted to the column address input buffer 101 as indicated by Ai in FIG. 13 and the external address Aa0 is inputted into the column address buffer/burst counter 102 by the internal clock signal ICLKA as indicated at YAi in FIG. 4. As PEN signal changes to a high level, after elapsing of delay time by the inverting circuits INV301 to INV304 shown in FIG. 12, PYE signal is also changed from low level to high level. CSL(E) and CSL(O) corresponding to the two addresses outputted from the column decoders (CDEC) 104 and 107 raise at cycle C2. The rising of CLS(E/O) according to the present invention are faster than that of CLS(E/O) according to the related art and a timing from the occurrence of this internal address YAi to a rising of CSL(E) and CSL(O) of the writing operation is similar to that of the reading-out operation to be described later.

In turn, since the present invention is carried out in a pre-fetch method, writing of data into the memory cell is started in the same manner as that of the related art after the second writing data (Aa1) is inputted, i.e. when the second external clock signal CLK produces at cycle C2, the data correspondingly to the address Aa0, Aa1 is transferred to the associated RWBST/N of even number and odd number and written into the associated memory cell though IOT/N and the sensing amplifier.

Although the fact that the writing operation is carried out from the second clock is the same as that of the related art, the rising of CSL(E) and CSL(O) signals of the present invention is faster by an amount corresponding to 1 clock period. Therefore, it is not necessary to wait for the rising of CSL(E) and CSL(O) as found in the related art. The timing of changing the CLS(E/O) can be performed in the same manner as that of the reading-out operation.

Writing against the subsequent two addresses Aa2 and Aa3 is carried out in the same manner as that of the addresses Aa0 and Aa1. PFEN signal is changed from the high level to the low level at C3 cycle, one-shot pulse of the internal clock signal ICLKA is generated. At that time, the internal address against the address Aa0, Aa1 changes into the internal address against the addresses Aa2, Aa3. Therefore, CSL line correspondingly to the address Aa2, Aa3 is selected. At this time, CSL signal is not the one-shot signal as found in the related art, but this is changed over continuously as indicated by CSL(E) and CSL(O) shown in FIG. 13.

Although the signals W0 and WA0 change from the high level to the low level with the internal clock signal ICLK at cycle C4, thereby the data-in-buffer 118, the write amplifiers (WA) 114 and 116 are disabled. The writing data (Aa2,Aa3) then is latched in DIN 118, and the signals W0 and WAE are changed from the low level to the high level, the data are written into the memory cells correspondingly to the two addresses Aa2 and Aa3, respectively.

The writing operation is carried out during 2 clock cycles in the same manner as that of the related art. The writing at the time of BL (burst length) of "4" is completed by a state in which WBST signal is raised to high level and PEN signal is changed from the high level to the low level after 4 clocks after WBST signal is raised to the high level and then the signal W0 and the signal WAE become from the high level to the low level. However, in this case, since the reading-out operation is started immediately at a next clock cycle (C5 cycle in FIG. 13), the signal PEN is kept at high level and the signal WBST is changed from the high level to the low level, thereby the signal W0 and the signal WAE are changed from the high level to the low level and then the operations completed.

At cycle C5, a start address of a new burst is inputted by changing-over from the writing operation to the reading-out operation. Therefore, two contiguous addresses Ab0 and Ab1 are generated in it by the internal clock signal ICLKA in the same manner as that of the writing operation, and finally each of the two CSL(E) and CSL(O) corresponding to the address Ab0, Ab1 is raised to a high level, respectively. A changing-over of the two CSL(E) and CSL(O) is carried out in the same manner as that of the changing-over in the case of writing operation. That is, also during the reading-out operation, two CSL(E) and CSL(O) are not controlled by one-shot. The clock signal ICLK2 becomes a high level in compliance with the raising of the two CSL(E) and CSL(O), and a signal DE outputted from the inverting circuit INV224 in the signal generating circuit 121 in FIG. 2 is changed from the low level to the high level. With such an arrangement as above, each of the data amplifiers (DA) 115 and 117 shown in FIG. 10 is activated so as to amplify data in the memory cell and to drive the signal RWBST/N (E/O).

After this operation, the signal DLA is generated as a one-shot signal, thereby latched by each of the flip-flops composed of inverting circuits INVB02 and INVB03, inverting circuits INVB04 and INVB05; inverting circuits INVB06 and INVB07; and inverting circuits INVB08 and INVB09 shown in FIG. 8.

At cycle C7, when the second CLk during the reading-out operation is produced, the SWR signal changes low level, therefore data correspondingly to the initial address Ab0 (even number) latched in the inverting circuits INVB02 and INVB03, inverting circuits INVB04 and INVB05 is outputted to OUT/N. Further, as shown in FIG. 4, the output enable (OE) signal is varied from the low level to the high level, thereby the data is outputted from DQ pin to the external side through the data-out-buffer 120.

SWR signal becomes a high level at the next clock CLK and data at the next address Ab1 (odd number) latched by the inverting circuits INVB06 and INVB07, inverting circuits INVB08 and INVB09 is outputted to OUT/N and then the data is outputted from DQ pin to the external side through the data-out-buffer 120.

In this way, CSL(E) and CSL(O) signals at the next two addresses (Ab2 and Ab3) are changed over with the previous CSL(E) and CSL(O) signals while the data of 2 bits read-out concurrently are being read out by applying 2 clocks. In view of this time, the read-out data, i.e. RWBST(E) and RWBST(O) are changed over by disabling DE signal with the signal generating circuit 121 shown in FIG. 2. Subsequently, in the same manner as that described above, data at the addresses Ab2 and Ab3 are outputted to the external side in sequence and then the reading-out operation on the burst length 4 is completed.

Figure 14:
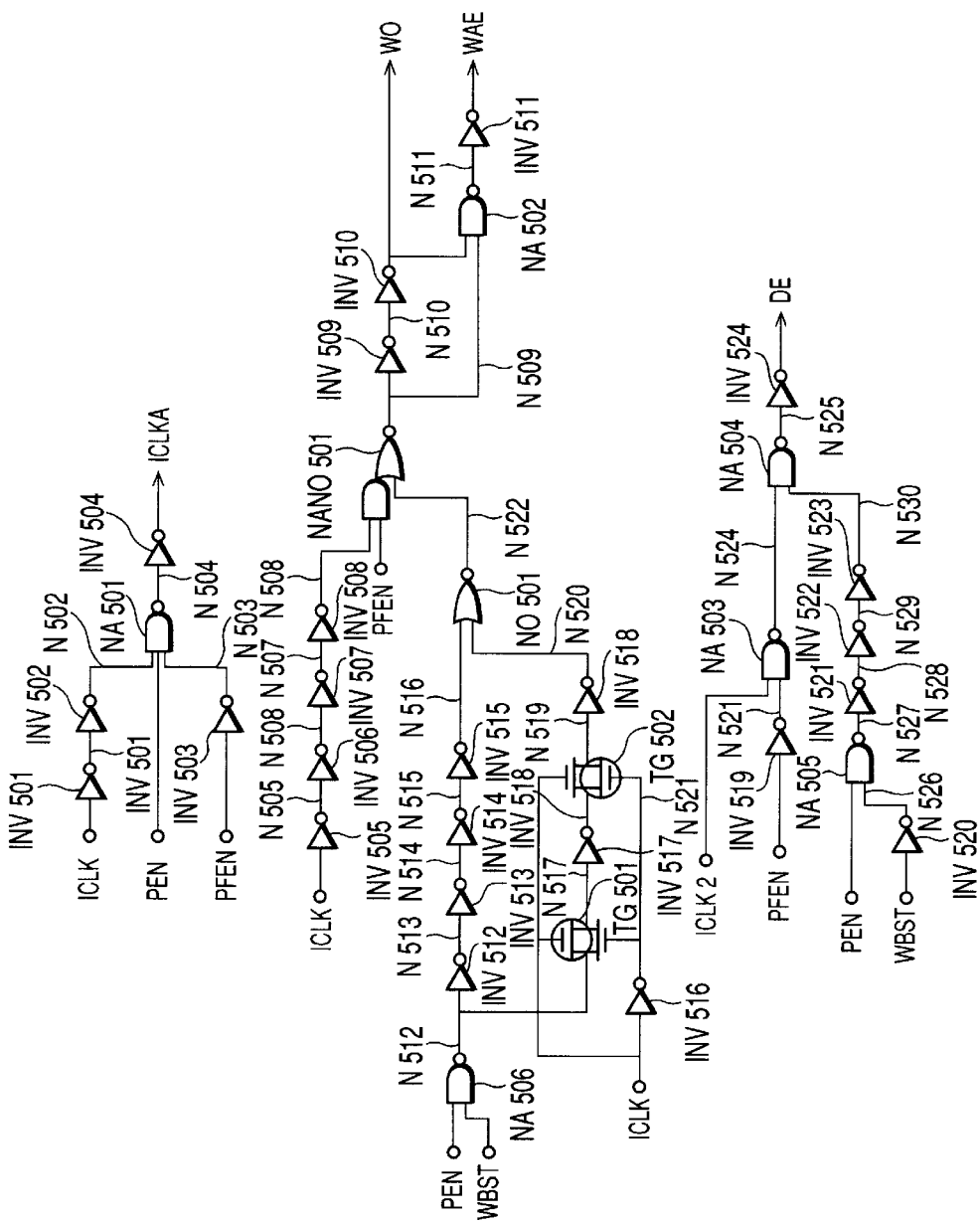
FIG. 14 is a detailed circuit diagram for showing a second embodiment of a signal generating circuit 121 of the present invention.

Next, a second preferred embodiment of the present invention will be described as follows. FIG. 14 is a circuit diagram for showing a second preferred embodiment of a signal generating circuit of the substantial part of the semiconductor memory device of the present invention. This signal generating circuit corresponds to the signal generating circuit 121 shown in FIG. 11, and this second preferred embodiment is the same as that of the entire configuration view except the signal generating circuit.

Comparing with the signal generating circuit 121 shown in FIG. 11, the signal generating circuit shown in FIG. 14 is the same as the signal generating circuit 121 shown in FIG. 11 in view of its circuit segments for generating the internal clock signal ICLKA, the signal W0 and the signal DE, although its circuit segment for generating the write amplification activating signal WAE is different from that of the former signal generating circuit. That is, the signal WAE responds to the signals clock2 and PFEN.

In the first preferred embodiment of the present invention, CSL(E) and CSL(O) corresponding to the next two addresses Aa0 and Aa1 are changed into CSL (E/O) corresponding to the next two addresses Aa2 and Aa3 over by the rising of the clock signal CLK of C3 cycle in FIG. 13. However, writing of data into the memory cells correspondingly to the two addresses Aa2 and Aa3 is carried out by a rising of the clock signal CLK of C4 cycle. That is, the timing of changing the CSL(E/O) and the timing of writing of data into the memory cells, or in other words, activating the signal WAE are not related directly to each other. Therefore, CSL(E) and CSL(O) may be changed over during a period in which the writing of the previous cycle is being carried out. That is, the previous data is written into the memory cell corresponding to a previous data. At that time, address changes the previous address to the next address. Therefore, the previous data is written into the memory cell corresponding to a next address and data changes from the previous data to the next data, the next data are written into the memory cell correspondingly to the next address. Although this operation is not wrong, CSLs not related to CSL(E) and CSL(O) corresponding to the next address may be raised, in the worst case, there is a possibility that data is written into the memory cell selected by the CSLs not related to that at the next address.

In view of this fact, the signal generating circuit of the second preferred embodiment shown in FIG. 14, the signal WAE is caused to be disabled during changing-over of signals CSL(E) and CSL(O). In other words, when CSLs are changes, the writing operation is temporarily interrupted to prevent an erroneous writing from being carried out.

Figure 15:
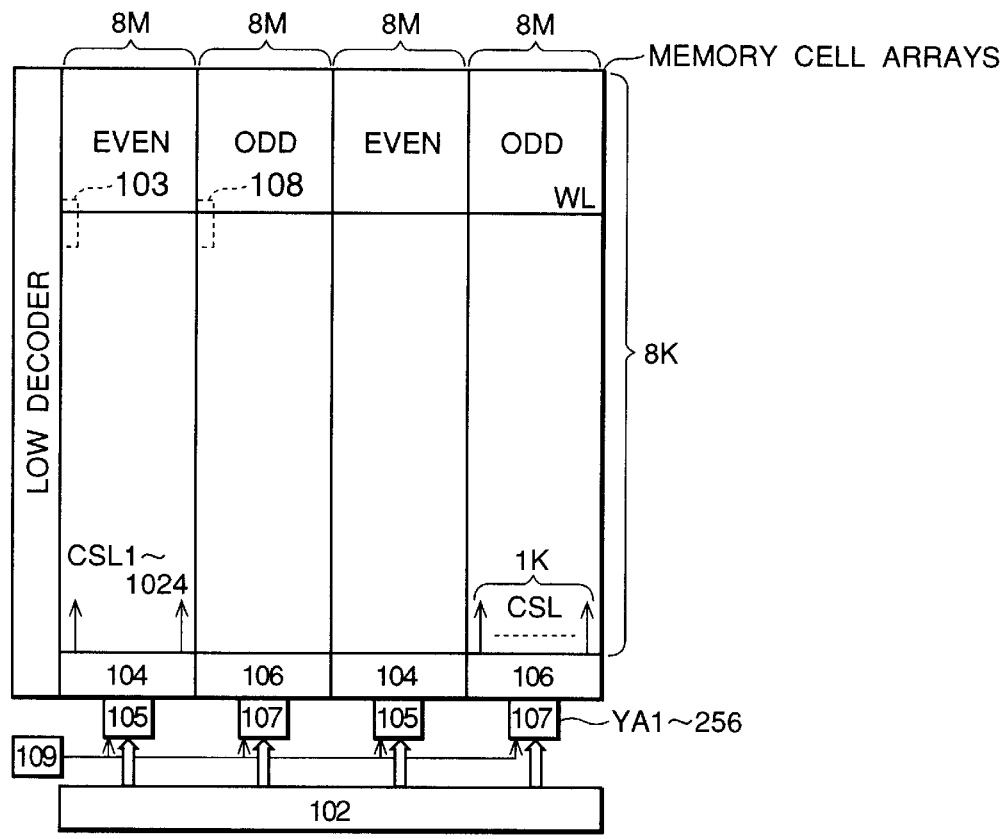
FIG. 15 is an actual layout illustrative of a semiconductor memory device of the present invention.

Referring to the FIG. 15, the actual memory cell array includes memory cells of 32M bit. The memory cells are divided into four memory cell arrays. The size of each of the memory cell arrays is 8M bit. EVEN address memory cell array and ODD address memory cell array are arranged alternately. The row decoder is arranged at the one side of the EVEN address memory cell. The row decoder is connected a plurality of word lines WL. The number of word lines WL is 8k. Each of the word lines passes over four memory cell arrays. The column pre-decoder 105 receives Y select address YA 1–256 and the column decoder 104 drives the respective level of CSL 1–1024. Each of the circuits 105 and 107 are of the same structure and each of the circuits 104 and 106 are of the same structure. Though there is shown only one memory cell in the memory cell array 103, 108, 603 or 608, actually, there are a plurality of memory cells (1–1024) in the memory cell array. Additionally, there are a plurality of SAs, DLT/Ns, QN101/102s correspondingly to the memory cells 1–1024. There are a plurality of, for example, sixteen data lines IOT and a plurality of, for example, sixteen data lines ION (not shown).

As described above, in accordance with the present invention, only the actual writing operation (i.e. up to the data-in-buffer—RWBST/N—IOT/N—a sensing amplifier—a memory cell) during operation of 2-bit pre-fetch system is delayed by an amount corresponding to 1 clock period, resulting in that it does not become necessary to delay an inputting of a read command when the operation is changed over from the writing operation to the reading-out operation and so a high speed reading-out operation can be carried out after the writing operation as compared with that of the related art.

In addition, in accordance with the present invention, various kinds of control signals such as enable signals to be used in each of the writing operation and the reading-out operation are controlled to a one-shot pulse only during a non-active period selected from an active period (a high level period) and a non-active period (a low level period) in response to the external clock signal, resulting in that an extending of the cycle enables the active period to be extended and so it is not necessary to shorten the active period so as to shorten an operation limit cycle and thus a timing set becomes simple and an operation margin in the circuit can be increased.

Further, in accordance with the present invention, since the writing operation is temporarily interrupted during a changing-over of a column select line, it is possible to prevent an erroneous writing during a changing-over of the column select line where there is a possibility that a plurality of column select lines are raised.

Although the preferred embodiments of the present invention has been described in detail, it should be understood that various changes, substitution and alternation can be made therein without departing from the spirit and scope of the invention as define by the appended claims. For example, it is no problem that the CAS latency changes other number, for example, 1, 2, 4, 5 . . . and the burst length changes other number, for example, 2,3,4,5 . . . . The semiconductor memory device of the embodiments is a 2-bit pre-fetch system. However, the present invention is not limited the 2-bit pre-fetch system. That is, the semiconductor memory device of the present invention can perform such a system that a plurality of data are inputed in serial from an external input terminal and the data are stored into an associated memory cell at the same time.

What is claimed is:

1. In a semiconductor memory device receiving in series a plurality of first data from an input terminal and simultaneously transferring each said first data into an associated memory cell during a writing operation, followed by simultaneously reading second data stored in a plurality of memory cells outputting in series said second data to an output terminal during a reading operation, a signal generating circuit producing timing and control signals causing a write operation to take place over a write time period from a write command to selection of a memory cell and a read operation to take place over a read time period from a read command to selection of a memory cell, said write time period being the same as said read time period.

2. The device as claimed in claim 1, further comprising a decoder outputting a select signal in response to an address and one of a write command and a read command, said select signal at least partially selecting one of said memory cells, wherein a period from an input of a write command until outputting by said decoder of said select signal in response to said write command is the same as a period from an input of read command until outputting by said decoder of said select signal in response to said read command.

3. A semiconductor memory device comprising:

a first memory cell;

at least a first data line for conveying data to and from said first memory cell;

a column select line selectively connecting/disconnecting said first data line to/from at least one input/output line;

a second memory cell;

at least a second data line for conveying data to and from said second memory cell;

a column select line selectively connecting/disconnecting said second data line to/from at least one input/output line; and a timing and control circuitry generating timing and control signals to which said column select line is responsive, said timing and control signals being such that a period until an activation of a column select line in response to write command at said writing operation is the same as a period until an activation of a column select line in response to read command at said reading operation.

4. The device as claimed in claim 3, further comprising a first decoder producing a first select signal to select a first column select line in response to a first internal address, a second decoder producing a second select signal to select a second column select line in response to a second internal address, an address buffer outputting said first and second internal addresses in response to an external address, and a signal-generating circuit producing timing signals causing a period from which an input of said external address until said address buffer outputs at least one of said first and second internal addresses during said writing operation is the same as a period from an input of said external address until said address buffer outputs at least one of said first and second internal addresses during said reading operation.

5. The device as claimed in claim 4, further comprising a PYE signal producing circuit activating at least one of said first and second decoders in response to a PYE signal, said PYE signal responding to a signal activated during a burst operation.

6. The device as claimed in claim 3, wherein said column select lines are responsive to select signals, further comprising a data input terminal, a data output terminal, wherein said data input terminal receives a first data and a second data in series and said first data and second data are stored in said first memory cell and said second memory cell respectively by activating at least one select signal to activate the column select line associated with each of said first and second memory cells, read circuitry for reading a third data and a fourth data latched in respective memory cells at the same time by activating at least one select signal and outputting said third and fourth data to said data output terminal in series, a period from input of said write command until select signals are activated during a write operation is the same as a period from input of said read command until select signals are activated during a read operation.

7. The device as claimed in claim 3, wherein said column select lines are responsive to select signals, further comprising a first decoder driving a first select signal in response to a first internal address, a second decoder driving a second select signal in response to a second internal address, an address buffer outputting said first and second internal addresses in response to an external address, a data input terminal, a data output terminal, wherein said data input terminal receives a first data and a second data in series and said first data and second data are stored in said first memory cell and second memory cell, respectively by activating said first and second select signals at the same time, read circuitry for reading a third data and a fourth data latched in respective memory cells by activating said first and second select signals at the same time and outputting said third data and fourth data to said data output terminal in series, wherein a period from an input of said external address until said address buffer outputs said first and second internal addresses during said writing operation is the same as a period from an input of said external address until said address buffer outputs said first and second internal addresses during said reading operation.

8. The device as claimed in claim 4, wherein said external address starts to produce in response to one shot pulse of an external clock by which write command is inputed.

9. The device as claimed in claim 3, wherein said writing operation is interrupted during changing selection of a column select line.

10. A semiconductor memory device comprising:

a first memory cell array;

at least one first memory cell in said first memory cell array;

a second memory cell array;

at least one second memory cell in said second memory cell array;

a first column decoder responsive to a first address for selecting at least a first column to select said first memory cell in response to said first address;

a second column decoder responsive to a second address for selecting at least a second column to select said second memory cell in response to said second address, said second address being contiguous to said first address;

a data input terminal which receives at least one of a first data and a second data, said first data to be stored according to said first address and said second data to be stored according to said second address; and control circuitry to select said first and second columns during a write operation before said second data and said first data are both input through said data input terminal to a data input buffer circuit.

11. The device as claimed in claim 10, wherein a period from an input of a write command until selection of first and second columns during a writing operation is the same as a period from an input of read command until selection of first and second columns during said reading operation.

12. The device as claimed in claim 11, wherein said first memory cell array is an even number address memory cell array and said second memory cell array is an odd number address memory cell array.

13. A semiconductor memory device comprising:

an even address number memory cell array;

at least one first memory cell in said even address number memory cell array, said first memory cell selected by a first address:

an odd address number memory cell array;

at least one second memory cell in said odd address number memory cell array, said second memory cell selected by a second address sequent to said first address;

a column address circuit for generating a plurality of even and odd internal addresses in response to an external address;

a first column decoder to select at least one column in response to an even internal address to thereby select said first memory cell in said even number memory cell array;

a second column decoder to select at least one second column in response to an odd internal address to select said second memory cell in said odd number memory cell array;

a data input terminal which serially receives a first data and a second data; and control circuitry to select said first and second columns while said second data subsequent to said first data is being received at said data input terminal to thereby write said first and second data into said first and second memory cells, respectively.

14. The device as claimed in claim 13, wherein a period from an input of a write command until a selection of first and second columns during a writing operation is the same as a period from an input of read command until selection of first and second columns during a reading operation.

15. A method of accessing memory cells of a semiconductor memory device, comprising the steps of:

receiving a write command during a first timing;

receiving a first external address during said first timing;

receiving a first data at a data terminal during said first timing;

receiving a second data at said data terminal during a second timing;

activating a first column selection signal and a second column selection signal, responsive to said first external address, during said second timing, so that a first memory cell corresponding to said first column selection signal is written to said first data and a second memory cell corresponding to said second column selection signal is written to said second data.

16. The method as claimed in claim 15, further comprising the steps of:

receiving a read command during a third timing;

receiving a second external address during said third timing;

activating a third column selection signal and a fourth column selection signal responsive to said second external address, during said third timing, so that a third data stored in a third memory cell corresponding to said third column selection signal is read out and a fourth data stored in a fourth memory cell corresponding to said fourth column selection signal is read out;

wherein a period between said first and second timings is the same as a period between said third and fourth timings.

17. The method as claimed in claim 16, wherein said first memory cell is said third memory cell, said second memory cell is said fourth memory cell, said first column selection signal is said third column selection signal, said second column selection signal is said fourth column selection signal, said first data is said third data, and said second data is said fourth data.

18. A synchronous dynamic random access memory comprising:

a first plurality of memory cells accessed by a row address and an even number column address;

a second plurality of memory cells accessed by a row address and an odd number column address;

a column address input circuit responsive to an external address for generating consecutive internal addresses including odd and even number internal addresses, column decoder circuitry producing column select signals, in response to internal addresses, designating selected columns, a data input circuit receiving and temporarily retaining plural bits of input data, a data output circuit receiving plural bits of output data from said first and second pluralities of memory cells, and signal generating circuitry producing signals controlling the writing and reading of data, said signal generating circuitry generating a column address enable signal to said column address decoder circuitry, said signal generating circuitry being responsive to a pipeline enable signal during burst operation of the synchronous dynamic random access memory, whereby said column select signals selecting at least plural columns are produced before plural data bits, to be stored in memory cells corresponding to selected columns designated by column select signals, are temporarily retained in said data input circuit.

19. The synchronous dynamic random access memory of claim 18, further including:

a timing and control signal generating circuitry producing an internal clock signal activated in response to the presence of an external clock signal, the presence of an active pipeline enable signal and an inactive pipeline prefetch enable signal, said column address input circuit including column address burst counter circuitry responsive to said internal clock signal for generating an internal address in response to activation of said internal clock signal.

20. The synchronous dynamic random access memory of claim 19, wherein said column decoder circuitry includes circuitry enabling reception of internal addresses during the activation period of said column address enable signal which remains active for the period of activation of said pipeline enable signal.

21. The synchronous dynamic random access memory of claim 20, wherein said column decoder circuitry includes:

column predecoder circuitry, and column decoder circuits.

\* \* \* \* \*